(12) United States Patent
Cattani et al.

(10) Patent No.: US 12,328,068 B2
(45) Date of Patent: Jun. 10, 2025

(54) DC-DC CONVERTER CIRCUIT AND CORRESPONDING METHOD OF TESTING A DC-DC CONVERTER CIRCUIT

(71) Applicant: STMicroelectronics S.r.l., Agrate Brianza (IT)

(72) Inventors: Alberto Cattani, Cislago (IT); Alessandro Gasparini, Cusano Milanino (IT); Stefano Ramorini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 234 days.

(21) Appl. No.: 18/121,767

(22) Filed: Mar. 15, 2023

(65) Prior Publication Data
US 2023/0299670 A1    Sep. 21, 2023

(30) Foreign Application Priority Data
Mar. 21, 2022   (IT) .......... 102022000005477

(51) Int. Cl.
*H02M 3/156*    (2006.01)
*H02M 1/00*    (2006.01)

(52) U.S. Cl.
CPC .......... *H02M 3/156* (2013.01); *H02M 1/0003* (2021.05)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247;
(Continued)

(56) References Cited

U.S. PATENT DOCUMENTS 6,603,326 B1    8/2003   Tse et al.
8,188,725 B2 *  5/2012   Draghi .................. G05F 1/575
                                                  323/280
(Continued)

OTHER PUBLICATIONS

IT Search Report and Written Opinion for priority application, IT 102022000005477, report dated Oct. 31, 2022, 7 pgs.

*Primary Examiner* — Jeffrey A Gblende
(74) *Attorney, Agent, or Firm* — Crowe & Dunlevy LLC

(57) ABSTRACT

A switching DC-DC converter circuit includes a switching stage having an input node receiving an input voltage and an output node producing an output voltage. The converter includes feedback loop circuitry coupled to the output node of the switching stage to produce, at a respective output node, a control signal of the converter circuit as a function of a difference between the output voltage and a reference voltage. The converter includes test loop circuitry arranged between an output node of the feedback loop circuitry and the output node of the switching stage. The test loop, when enabled, sources a current to the output node of the switching stage or sinks a current from the output node of the switching stage as a function of a value of the control signal of the converter circuit. The feedback loop circuitry is calibrated during a test phase of the switching DC-DC converter circuit.

19 Claims, 3 Drawing Sheets

(58) Field of Classification Search
CPC .......... G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069
See application file for complete search history.

(56) References Cited

U.S. PATENT DOCUMENTS

| | | | |
|---|---|---|---|
| 8,773,096 B2* | 7/2014 | Wang | G05F 1/575 |
| | | | 323/280 |
| 9,239,584 B2* | 1/2016 | Lerner | G05F 1/56 |
| 9,543,834 B2* | 1/2017 | Izumoto | H02M 3/156 |
| 2021/0391869 A1 | 12/2021 | Deford | |
| 2025/0047204 A1* | 2/2025 | Nandimandalam Venkata | H02J 7/007184 |

* cited by examiner

DC-DC CONVERTER CIRCUIT AND CORRESPONDING METHOD OF TESTING A DC-DC CONVERTER CIRCUIT

PRIORITY CLAIM

This application claims the priority benefit of Italian Application for Patent No. 102022000005477 filed on Mar. 21, 2022, the content of which is hereby incorporated by reference in its entirety to the maximum extent allowable by law.

TECHNICAL FIELD

This disclosure relates to DC-DC converter circuits and to methods of testing DC-DC converter circuits (e.g., integrated circuit testing, IC testing) to trim and/or calibrate them. For instance, one or more embodiments may be applied in power management integrated circuits (PMIC) for active-matrix organic light-emitting diode (AMOLED) display drivers.

BACKGROUND

DC-DC converters are used in a wide variety of applications to generate the appropriate supply voltages used by complex systems to operate and provide the expected performance. In many of these applications, the DC-DC converter is expected to provide a precise output voltage to fulfill the specifications of the application. Therefore, the expected working point of the DC-DC converter (e.g., the expected output voltage) is to be considered during the converter design phase, in particular to consider the statistical and/or systematic errors that are typical of integrated electronic circuits. Dedicated trimming circuits can be implemented in the DC-DC converter in order to be able to compensate such errors during an IC testing phase carried out during the IC manufacturing process (e.g., before dicing and packaging, or even on a final sample that has been singulated and packaged).

Therefore, the trimming circuits implemented into the integrated circuit are set during the IC testing phase to meet the expected performance of the chip. However, in many automatic test setups (e.g., automatic test equipment (ATE)) it may not be possible nor convenient to test a DC-DC converter working in closed-loop, e.g., because the non-optimized connections of the ATE may produce instability issues (e.g., due to board parasitic effects and other non-idealities), and/or because the ATE measurements may be subject to noise, and/or because of the excessive time used for carrying out precise ATE measurements on switching DC-DC converters.

A known approach conventionally used to measure the accuracy of a DC-DC converter during the testing phase and consequently trim the converter itself relies on implementing a closed-loop architecture on the automatic test board and operating the converter in normal regulation mode (i.e., as it would operate in the final application) during testing. This approach increases the complexity and the cost of the test board to be used, and may still fail in having the DC-DC converter operating in a stable condition. Additionally, even if stable operation of the converter were to be achieved, the output voltage of the converter may exhibit a ripple that is to be filtered in order to measure the precise value of the regulated output voltage. Ripple filtering may typically be implemented by applying a long-time average, which leads to an excessively long testing time that turns into an increased testing cost, particularly in the case of DC-DC converters having multiple outputs to be tested.

Another known approach can be used to measure the accuracy of a DC-DC converter and consequently trim the converter itself, but this is limited to cases where the converter can operate in pulse-skip condition. This approach relies on operating the converter in open-loop condition (e.g., without inductor) during testing, forcing the output voltage to a value that is close to the expected regulated value, and analyzing the behavior of the converter switching node (e.g., sensing the voltage at the switching node). If the output voltage is forced to a value lower than the required setpoint (expected value), the switching node exhibits a switching activity because the DC-DC converter tries to increase the output voltage but cannot succeed because there is no external inductor. If the output voltage is forced to a value higher than the required setpoint, the switching node does not exhibit a switching activity because the DC-DC converter enters in pulse-skip operation mode. Therefore, by forcing a ramp voltage signal at the output node of the converter it is possible to detect the voltage value at which the converter stops switching, which can be estimated to be the precise converter output value. However, this testing method is not applicable to all DC-DC converters (e.g., DC-DC converters operating in forced continuous conduction mode (CCM) will not have this behavior). Additionally, this testing method involves applying a slow ramp in order to improve the precision of the measurement, and therefore also results in an excessively long testing time that turns into an increased testing cost, particularly in the case of DC-DC converters having multiple outputs to be tested.

Therefore, there is a need in the art to provide improved DC-DC converters and related testing methods that make the testing phase easier, faster and/or more convenient.

There is also a need in the art to contribute in providing such improved DC-DC converters and related testing methods.

SUMMARY

One or more embodiments relate to a DC-DC converter circuit.

One or more embodiments relate to a corresponding method of testing a DC-DC converter circuit.

In one or more embodiments, a switching DC-DC converter circuit includes a switching stage having an input node configured to receive an input voltage and an output node configured to produce an output voltage. The converter includes feedback loop circuitry coupled to the output node of the switching stage and configured to produce, at a respective output node, a control signal of the converter circuit as a function of a difference between the output voltage and a reference voltage. The converter includes test loop circuitry arranged between an output node of the feedback loop circuitry and the output node of the switching stage. The test loop circuitry is configured, when enabled, to source a current to the output node of the switching stage or to sink a current from the output node of the switching stage as a function of a value of the control signal of the converter circuit. The feedback loop circuitry is calibratable (e.g., trimmable) during a test phase of the switching DC-DC converter circuit.

One or more embodiments thus facilitate testing and calibrating a DC-DC converter circuit.

In one or more embodiments, the test loop circuitry includes one or more enabling switches configured to selectively couple the test loop circuitry to the output node of the feedback loop circuitry and/or to the output node of the switching stage. The test loop circuitry is enabled by turning on the one or more enabling switches and disabled by turning off the one or more enabling switches.

In one or more embodiments, the test loop circuitry is permanently coupled between the output node of the feedback loop circuitry and the output node of the switching stage. The test loop circuitry is enabled and disabled as a function of a test mode signal.

In one or more embodiments, the test loop circuitry includes a first transistor having a control terminal coupled to the output node of the feedback loop circuitry to receive the control signal, so that the current flowing through the first transistor is a function of the control signal. The test loop circuitry includes a current-to-voltage conversion circuit configured to produce a transistor control voltage for controlling an output transistor as a function of the current flowing through the first transistor. The test loop circuitry includes an output transistor coupled to the output node of the switching stage. The output transistor is configured to receive, at a respective control terminal, the transistor control voltage and to source a current to the output node of the switching stage or to sink a current from the output node of the switching stage as a function of a value of the transistor control voltage.

In one or more embodiments, the first transistor comprises a p-channel MOS transistor having a source terminal coupled to a first supply voltage rail and a gate terminal coupled to the output node of the feedback loop circuitry to receive the control signal. The current-to-voltage conversion circuit comprises a current mirror circuit having a mirror input node coupled to a drain terminal of the first transistor and a mirror output node coupled to a first terminal of a resistor, the resistor having a second terminal coupled to a second supply voltage rail. The output transistor comprises a p-channel MOS transistor having a source terminal coupled to the second supply voltage rail, a gate terminal coupled to the first terminal of the resistor, and a drain terminal coupled to the output node of the switching stage. The output transistor is configured to source a current to the output node of the switching stage.

In one or more embodiments, the first supply voltage rail is an internal supply voltage rail of the converter circuit, and the second supply voltage rail is configured to receive the input voltage of the converter circuit.

In one or more embodiments, the first transistor comprises an n-channel MOS transistor having a source terminal coupled to ground and a gate terminal coupled to the output node of the feedback loop circuitry to receive the control signal. The current-to-voltage conversion circuit comprises a resistor having a first terminal coupled to a drain terminal of the first transistor and a second terminal coupled to a supply voltage rail. The output transistor comprises an n-channel MOS transistor having a source terminal coupled to ground, a gate terminal coupled to the first terminal of the resistor, and a drain terminal coupled to the output node of the switching stage. The output transistor is configured to sink a current from the output node of the switching stage.

In one or more embodiments, the feedback loop circuitry includes a feedback voltage divider circuit coupled to the output node of the switching stage and configured to produce a feedback voltage as a function of a voltage partitioning of the output voltage, and an error amplifier configured to amplify a difference between the feedback voltage and the reference voltage to produce the control signal. An offset voltage of the error amplifier and/or the reference voltage of the error amplifier are calibratable (e.g., trimmable) during a test phase of the switching DC-DC converter circuit.

In one or more embodiments, the feedback voltage divider circuit includes a digital-to-analog converter circuit configured to convert a digital signal into an analog voltage signal, a buffer circuit configured to receive the analog voltage signal output by the digital-to-analog converter circuit and produce a buffered analog voltage signal, and a voltage ladder circuit arranged between an output node of the buffer circuit and the output node of the switching stage and configured to produce, at an intermediate node thereof, the feedback voltage. An offset voltage of the buffer circuit is calibratable (e.g., trimmable) during a test phase of the switching DC-DC converter circuit.

In one or more embodiments, the feedback voltage divider circuit includes a voltage ladder circuit arranged between the output node of the switching stage and a ground node and configured to produce, at an intermediate node thereof, the feedback voltage.

In one or more embodiments, a switching DC-DC converter circuit further includes voltage ramp generation circuitry configured to produce a ramp signal, and a comparator circuit configured to compare the ramp signal to the control signal to produce a pulse-width modulated signal for controlling the switching activity of the switching stage. Optionally, the voltage ramp generation circuitry includes a ramp generator circuit configured to produce a base ramp signal, a current sensing circuit configured to sense the current flowing through one or more switches of the switching stage and produce a signal indicative of the sensed current, and an adder circuit configured to add up the base ramp signal and the signal indicative of the sensed current to produce the ramp signal.

In one or more embodiments, a method of testing a switching DC-DC converter circuit according to one or more embodiments includes the steps of:
  setting the switching DC-DC converter circuit into a test operation mode by preventing the switching activity of the switching stage and enabling the test loop circuitry;
  sourcing a current to the output node of the switching stage or sinking a current from the output node of the switching stage as a function of a value of the control signal of the converter circuit via the test loop circuitry;
  sinking a current from the output node of the switching stage or sourcing a current to the output node of the switching stage via an external current generator arrangement;
  sensing the value of the output voltage produced at the output node of the switching stage; and
  calibrating one or more electronic components of the feedback loop circuitry until a desired value of the output voltage is produced at the output node of the switching stage.

In one or more embodiments, the method comprises calibrating an offset voltage of the error amplifier and/or calibrating the reference voltage of the error amplifier until a desired value of the output voltage is produced at the output node of the switching stage.

In one or more embodiments, the method comprises calibrating an offset voltage of the error amplifier and/or calibrating an offset voltage of the buffer circuit until a desired value of the output voltage is produced at the output node of the switching stage.

BRIEF DESCRIPTION OF THE DRAWINGS

One or more embodiments will now be described, by way of example, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any suitable way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
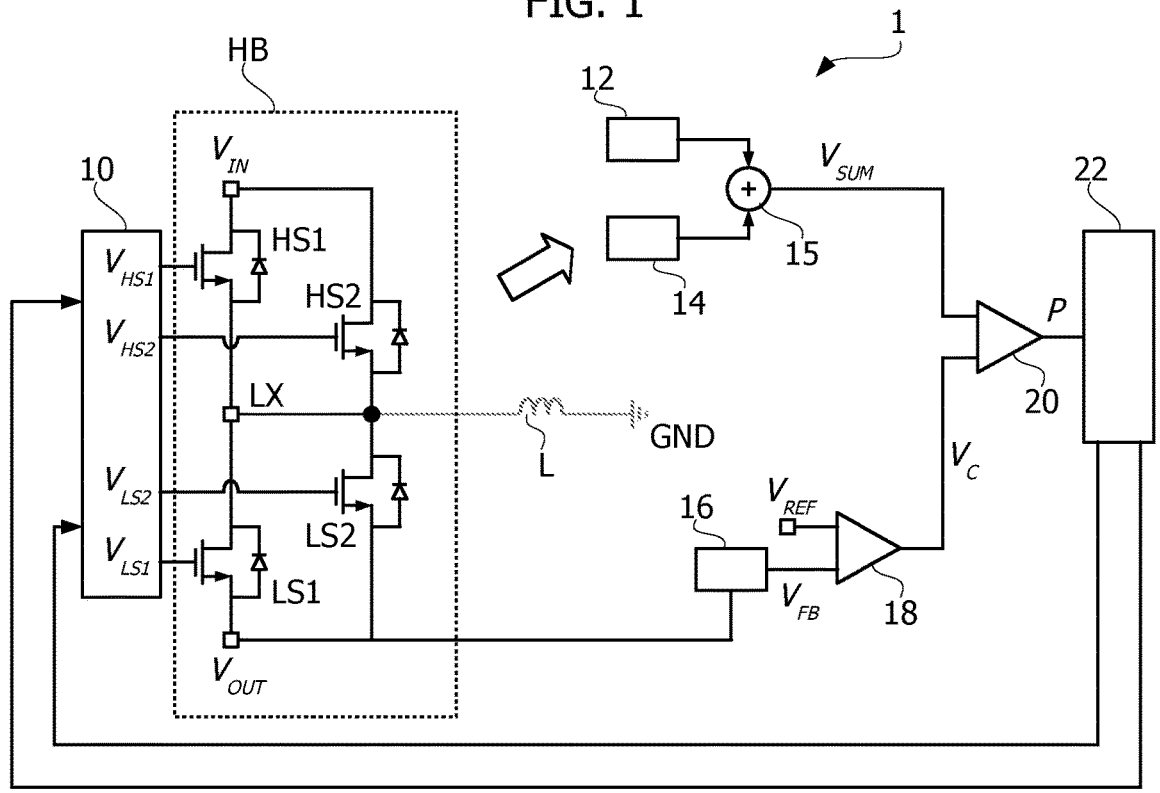
FIG. 1 is a circuit block diagram exemplary of a conventional DC-DC buck-boost converter device.

By way of introduction to the detailed description of exemplary embodiments, reference may first be made to FIG. 1, which is a circuit block diagram exemplary of a DC-DC converter device 1, in particular a buck-boost DC-DC converter including a current-controlled feedback loop. A DC-DC converter 1 as exemplified in FIG. 1 comprises a switching stage HB (e.g., a half-bridge circuit) having an input node configured to receive an input voltage VIN and an output node configured to produce an output voltage $V_{OUT}$. For instance, the switching stage HB may include a first high-side switch HS1 coupled between the input node and a switching node LX, and a first low-side switch LS1 coupled between the switching node LX and the output node. The switching stage HB may further include a second high-side switch HS2 coupled between the input node and the switching node LX, and a second low-side switch LS2 coupled between the switching node LX and the output node, e.g., in case the DC-DC converter 1 involves dynamic control of the switching stage HB to adapt to different operating conditions. As exemplified in FIG. 1, switches HS1, HS2, LS1 and LS2 may include (power) transistors such as metal-oxide-semiconductor field-effect transistors (MOSFETs), e.g., n-channel MOS transistors. An inductor L (e.g., an external inductor) may be coupled between the switching node LX and a ground node GND, e.g., when the DC-DC converter chip 1 is mounted on a printed circuit board (PCB) in the final application.

As exemplified in FIG. 1, DC-DC converter 1 may further comprise a ramp generator circuit 12, a current sensing circuit 14 coupled to one or more of the high-side switches of the switching stage HB (e.g., configured to sense the current flowing through the high-side switch HS1 and/or HS2), and an adder node 15 configured to add up the output signals from the ramp generator circuit 12 and the current sensing circuit 14 to produce a ramp signal $V_{SUM}$.

As exemplified in FIG. 1, DC-DC converter 1 may further comprise a feedback voltage divider circuit 16 coupled to the output node of the switching stage HB and configured to produce a feedback voltage $V_{FB}$ indicative of the output voltage $V_{OUT}$ (e.g., proportional to the output voltage $V_{OUT}$), and an error amplifier 18 having a first input configured to receive a reference voltage $V_{REF}$ and a second input configured to receive the feedback voltage $V_{FB}$ from circuit 16 to produce a control voltage $V_C$ of the DC-DC converter 1.

As exemplified in FIG. 1, DC-DC converter 1 may further comprise a comparator circuit 20 (e.g., a voltage comparator) configured to compare the ramp signal $V_{SUM}$ to the control signal $V_C$ to produce a pulse-width modulated signal P for controlling the switching activity of the switching stage HB. The DC-DC converter 1 may further comprise a digital circuit 22 configured to receive the PWM signal P from comparator 20 and produce a high-side activation signal and a low-side activation signal for the switching stage HB, and a driver circuit 10 coupled to the digital circuit 22 and to the switching stage HB and configured to produce drive signals $V_{HS1}$, $V_{HS2}$, $V_{LS1}$, $V_{LS2}$ for driving the commutation of switches HS1, HS2, LS1, LS2 as a function of the received high-side and low-side activation signals.

FIG. 1 is thus exemplary of a peak-current feedback loop of a DC-DC converter 1 that is suitable to be tested according to one or more of the known approaches previously discussed.

In order to mitigate or overcome one or more of the disadvantages of the known testing architectures previously discussed, one or more converter embodiments may rely on the provision of an auxiliary loop (e.g., a linear loop) for testing purposes in the converter architecture. Such an auxiliary loop may facilitate measuring the accuracy of the DC-DC converter and/or applying trimming procedures in a smarter, easier and/or faster way during the testing phase. In particular, provision of an auxiliary loop may allow carrying out a test procedure that does not rely on the outcome of difficult and/or unreliable measurements conducted in switching conditions.

Figure 2:
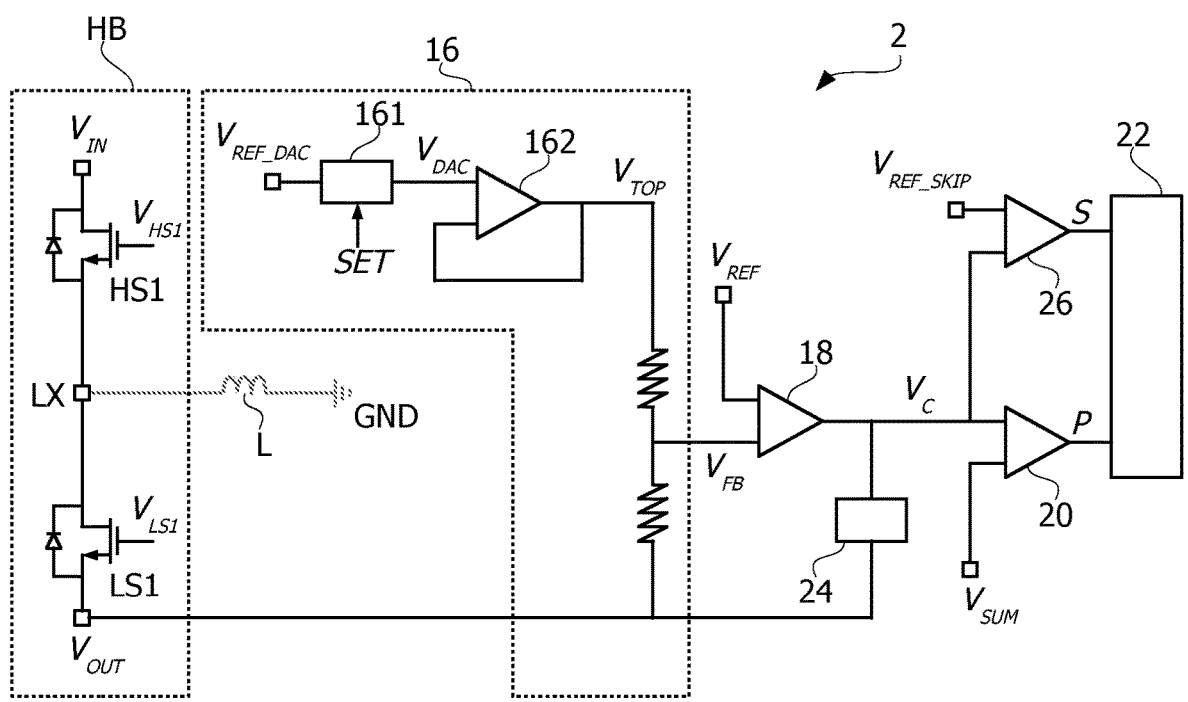
FIG. 2 is a circuit block diagram exemplary of a DC-DC buck-boost converter device including an auxiliary loop for testing according to one or more embodiments of the present disclosure.

For instance, FIG. 2 is a circuit block diagram exemplary of a DC-DC converter device 2, in particular a buck-boost DC-DC converter, including a main feedback loop as discussed with reference to FIG. 1 and an auxiliary loop 24 that is intended to be used for trimming purposes during the test phase of the converter integrated circuit. For instance, the auxiliary loop 24 may be arranged between the output of the error amplifier 18 and the output node of the switching stage HB. During normal operation of the DC-DC converter 2 (e.g., when converter 2 is implemented in the final application), the auxiliary loop 24 is maintained inactive (e.g., switched off) so that it does not affect normal operation of the converter 2 and does not increase the power consumption. For instance, the auxiliary loop 24 may be disconnected from the output of the error amplifier 18 and/or from the output node of the switching stage HB via one or more electronic switches (not visible in the FIGS. 2, 3 and 4 but whose design and implementation may be provided by one skilled in the art); additionally, or alternatively, the auxiliary loop 24 may be kept connected to the error amplifier 18 and/or to the switching stage HB, but may be de-activated or turned off. During the testing phase, instead, the auxiliary loop 24 is connected as illustrated in FIG. 2 and enabled to correctly address the linear loop testing method, during which the switching activity of the main feedback loop of the DC-DC converter 2 is kept on hold (e.g., halted, prevented, disabled, blocked). For instance, the converter 2 may be kept on hold by disabling the converter clock so as to stop the switching activity, and/or by disabling one or more of the control circuits such as comparators (e.g., comparator 20) or digital cores (e.g., digital circuit 22) of the DC-DC converter.

By way of example, FIG. 2 also shows a possible implementation of the feedback voltage divider circuit 16. As exemplified in FIG. 2, circuit 16 may comprise a digital-to-analog converter circuit 161 (e.g., a 7-bit DAC converter) configured to receive a reference voltage $V_{REF\_DAC}$ and a digital signal SET (e.g., a 7-bit signal), and to produce an analog voltage $V_{DAC}$ corresponding to the value of digital signal SET (e.g., proportional to signal SET) on an output full-range equal to $V_{REF\_DAC}$. Circuit 16 may further comprise a buffer circuit 162 coupled to the output of the DAC circuit 161 and configured to receive therefrom the analog signal $V_{DAC}$ to produce a buffered analog voltage $V_{TOP}$. A voltage ladder has a first end configured to receive the analog voltage $V_{TOP}$ and a second end configured to receive the converter output voltage $V_{OUT}$ to produce, at an intermediate node of the ladder, the feedback voltage $V_{FB}$. For instance, the voltage ladder may be a resistive ladder including a first resistor coupled between the output of buffer 162 and the feedback input of the error amplifier 18, and a second resistor coupled between the feedback input of the error amplifier 18 and the output of the switching stage HB of converter 2.

By way of example, FIG. 2 also shows pulse-skip circuitry that may be implemented in the DC-DC converter 2. For instance, the pulse-skip circuitry may include a skip comparator 26 (e.g., a comparator with hysteresis) configured to compare the control voltage $V_C$ to a reference voltage $V_{REF\_SKIP}$ to produce a skip signal S that is fed to the digital circuit 22.

Figure 3:
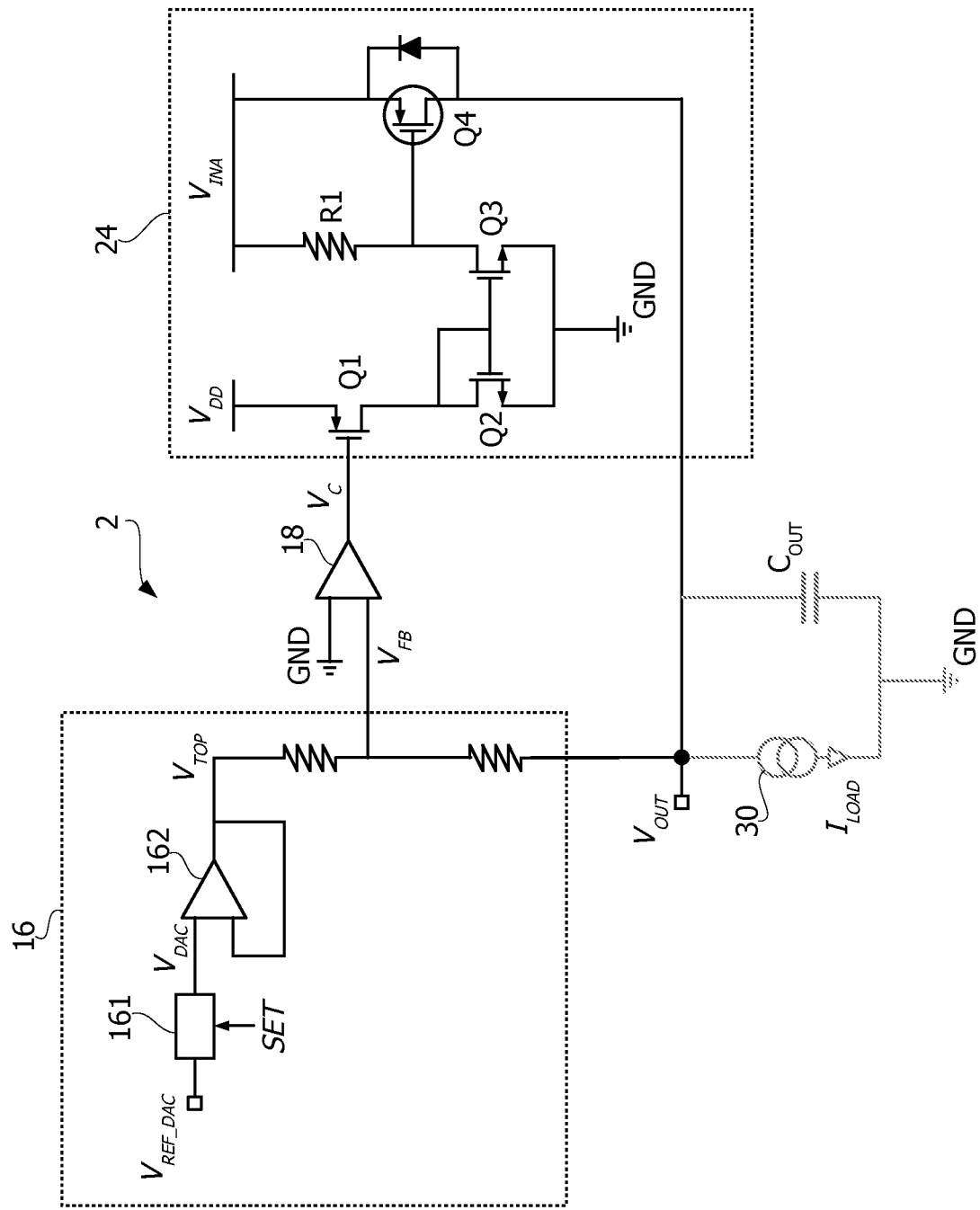
FIG. 3 is a circuit block diagram exemplary of implementation details of a DC-DC buck-boost converter device including an auxiliary loop for testing according to one or more embodiments of the present disclosure.

FIG. 3 is a circuit block diagram exemplary of certain components of the buck-boost DC-DC converter 2 illustrated in FIG. 2, during a test phase. In particular, FIG. 2 is exemplary of a possible implementation of the auxiliary loop circuit 24. The auxiliary loop circuit 24 may include a first current flow line arranged between an (e.g., internal) supply voltage rail that provides an (e.g., internal) supply voltage $V_{DD}$ and ground GND. The first current flow line may include a p-channel MOS transistor Q1 and an n-channel MOS transistor Q2 coupled in series. Transistor Q1 has a source terminal coupled to the supply voltage rail $V_{DD}$, a gate terminal coupled (e.g., via a closed switch not visible in the Figures annexed herein) to the output of the error amplifier 18 to receive the control voltage $V_C$, and a drain terminal coupled to the drain terminal of transistor Q2. Transistor Q2 has a source terminal coupled to ground GND and a gate terminal coupled to its drain terminal (i.e., it is diode-connected). The auxiliary loop circuit 24 may include a second current flow line arranged between a supply voltage rail that provides a supply voltage VINA and ground GND. In one or more embodiments, supply voltage VINA may be the same as the converter input voltage VIN. Alternatively, supply voltage VINA may be the same as the converter internal supply voltage $V_{DD}$. The second current flow line may include a resistor R1 and an n-channel MOS transistor Q3 coupled in series. Resistor R1 has a first terminal coupled to the supply voltage rail VINA and a second terminal coupled to the drain terminal of transistor Q3. Transistor Q3 has a source terminal coupled to ground GND and a gate terminal coupled to the gate terminal of transistor Q2, so that transistors Q2 and Q3 implement a current mirror where the current flowing through transistor Q2 is mirrored through transistor Q3. The auxiliary loop circuit 24 may include a p-channel MOS transistor Q4 arranged between the supply voltage rail VINA and the output node of the switching stage HB that produces voltage $V_{OUT}$. In particular, transistor Q4 may have a source terminal coupled to the supply voltage rail VINA, a drain terminal coupled to the output node of the switching stage HB, and a gate terminal coupled to a node intermediate resistor R1 and transistor Q3.

As exemplified in FIG. 3, during the test phase of converter 2, an external current source 30 (or an equivalent external voltage source having a resistor coupled in series) is connected to the output node of the DC-DC converter 2 to sink therefrom a current LOAD, e.g., using the external hardware available in the automatic test equipment. An external capacitor $C_{OUT}$ may also be connected between the output node of the converter 2 and ground GND. Therefore, during testing a current LOAD is sunk from the output node of converter 2.

It is also noted that, in one or more embodiments as exemplified in FIG. 3, the reference input of the error amplifier 18 may be coupled to ground GND (e.g., the reference voltage $V_{REF}$ may be the ground voltage, e.g., 0 V).

Substantially, during the test phase of the converter 2, the auxiliary loop circuit 24 is connected between the output node of the error amplifier 18 and the output node of the switching stage HB (e.g., via one or more electronic switches not visible in the Figures annexed herein) and enabled to operate as discussed in the following. With the test mode enabled (e.g., as a function of the value of a test mode signal) and the external current LOAD forced by the ATE, a loop is provided, which comprises the feedback voltage divider circuit 16 with the respective reference voltage generating circuit (i.e., DAC 161 and buffer 162), the error amplifier 18 and the auxiliary loop 24. The auxiliary loop 24 receives the control voltage $V_C$ produced by the error amplifier 18 as its input signal. The conductivity of transistor Q1 (e.g., its on-off state) is thus modulated as a function of the control voltage $V_C$. In turn, the current flowing through transistors Q1 and Q2 is modulated as a function of voltage $V_C$. Since this current is mirrored and forced to flow through transistor Q3 and resistor R1, the gate voltage of transistor Q4 is also modulated as a function of voltage $V_C$. In turn, the current flowing through transistor Q4 and injected into the output node of the switching stage HB is also modulated as a function of voltage $V_C$. The loop thus regulates the output voltage $V_{OUT}$ to the chosen value and, at steady state, the external current LOAD will flow through transistor Q4. In this regulation condition, the circuit blocks involved in the loop (i.e., the feedback voltage divider circuit 16 and the error amplifier 18) are the same blocks that are operated also during normal operation of the DC-DC converter 2. Therefore, the contributions to the inaccuracy of converter 2 due to circuits 16 and 18 are taken into account in the testing phase, while the additional inaccuracy generated by the auxiliary loop 24 can be neglected because circuit block 24 is arranged downstream of the error amplifier 18 that typically introduces a high gain (e.g., 60 dB to more than 100 dB), so that the contribution of loop 24 to the value of the output voltage $V_{OUT}$ is substantially negligible. During testing, the capacitance of the external capacitor $C_{OUT}$ and the value of the external current $I_{LOAD}$ can be selected (e.g., adjusted) to ensure stability of the loop.

Figure 4:
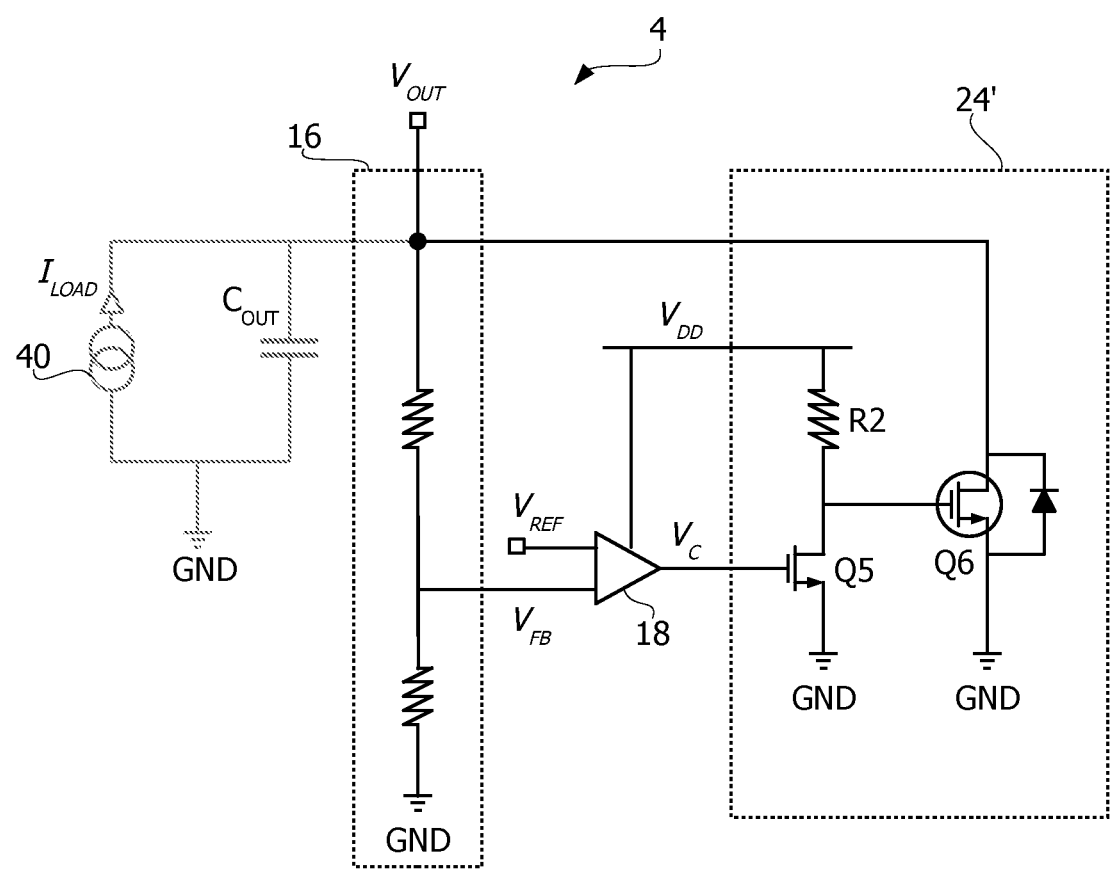
FIG. 4 is a circuit block diagram exemplary of implementation details of a DC-DC boost converter device including an auxiliary loop for testing according to one or more embodiments of the present disclosure.

In one or more embodiments, a trimming procedure carried out during testing of the DC-DC converter 2 may comprise enabling the auxiliary loop 24 as discussed in the foregoing (e.g., connecting the loop circuitry 24 to the error amplifier 18 by closing a respective switch, not visible in FIGS. 2, 3 and 4, while transistor Q4 may be permanently connected to the output node of the switching stage FIB) and then setting (e.g., adjusting) the available trimming points in the main control loop of converter 2 to adjust the value of the output voltage $V_{OUT}$ to the desired value. For instance, the error amplifier 18 may be trimmed by calibrating its offset in a suitable manner, and/or the buffer circuit 162 may be trimmed by calibrating its offset in a suitable manner. The trimming procedure disclosed herein thus takes into consideration all the circuit blocks (16 and 18) that affect the accuracy of converter 2 during normal operation (i.e., in application conditions), so the trimmed output value $V_{OUT}$ will be as close as possible to the output value that will occur in normal operation of the converter 2. Additionally, in case of any shift needed, it can also be possible to trim the value of the output voltage $V_{OUT}$ with a slightly different target value, so as to arrange the normal operation of converter 2 including an optional shift.

FIG. 4 is a circuit block diagram exemplary of certain components of a boost DC-DC converter 4. In particular, FIG. 4 is exemplary of a possible implementation of an auxiliary loop circuit 24' that can be provided arranged between the output node of error amplifier 18 and the output node of switching stage HB of a boost DC-DC converter. For the sake of brevity, certain components (e.g., the specific arrangement of the high-side switch, the low-side switch and the external inductor in the switching stage) of boost converter 4 are not illustrated in FIG. 4. The auxiliary loop circuit 24' may include a current flow line arranged between an (e.g., internal) supply voltage rail that provides an (e.g., internal) supply voltage $V_{DD}$ and ground GND. The current flow line may include a resistor R2 and an n-channel MOS transistor Q5 coupled in series. Resistor R2 has a first terminal coupled to the supply voltage rail $V_{DD}$ and a second terminal coupled to the drain terminal of transistor Q5. Transistor Q5 has a source terminal coupled to ground GND and a gate terminal coupled to the output of the error amplifier 18 (e.g., via a closed switch not visible in the Figures annexed herein) to receive the control voltage $V_C$. The auxiliary loop circuit 24' may include an n-channel MOS transistor Q6 arranged between the output node of the switching stage HB that produces voltage $V_{OUT}$ and ground GND. In particular, transistor Q6 may have a source terminal coupled to ground GND, a drain terminal coupled to the output node of the switching stage HB and a gate terminal coupled to a node intermediate resistor R2 and transistor Q5.

As exemplified in FIG. 4, during the test phase of converter 4, an external current source 40 (or an equivalent external voltage source having a resistor coupled in series) is connected to the output node of the DC-DC converter 4 to source thereto a current LOAD, e.g., using the external hardware available in the automatic test equipment. An external capacitor $C_{OUT}$ may also be connected between the output node of converter 4 and ground GND. Therefore, during testing a current LOAD is sourced to the output node of converter 4.

Substantially, the test operation of a DC-DC boost converter 4 as exemplified in FIG. 4 is based on the same approach discussed with reference to the DC-DC buck-boost converter 2 of FIG. 3. Also in this example, during the test phase of converter device 4, the auxiliary loop circuit 24' is connected between the output node of the error amplifier 18 and the output node of the switching stage HB (e.g., via one or more electronic switches not visible in the Figures annexed herein) and enabled to operate as discussed in the following. With the test mode enabled (e.g., as a function of the value of a test mode signal) and the external current LOAD forced by the ATE, a loop is provided which comprises the feedback voltage divider circuit 16, the error amplifier 18 and the auxiliary loop 24'. The auxiliary loop 24' receives the control voltage $V_C$ produced by the error amplifier 18 as its input signal. The conductivity of transistor Q5 (e.g., its on-off state) is thus modulated as a function of the control voltage $V_C$. In turn, the current flowing through transistor Q5 and resistor R2 is modulated as a function of voltage $V_C$. The gate voltage of transistor Q6 is thus also modulated as a function of voltage $V_C$. In turn, the current flowing through transistor Q6 and sunk from the output node of the switching stage HB is also modulated as a function of voltage $V_C$. The loop thus regulates the output voltage $V_{OUT}$ to the chosen value and, at steady state, the external current LOAD will flow through transistor Q6. In this regulation condition, the circuit blocks involved in the loop (i.e., the feedback voltage divider circuit 16 and the error amplifier 18) are the same blocks that are operated also during normal operation of the DC-DC converter 4. Therefore, the contributions to the inaccuracy of converter 4 due to circuits 16 and 18 are taken into account in the testing phase, while the additional inaccuracy generated by the auxiliary loop 24' can be neglected because circuit block 24' is arranged downstream of the error amplifier 18. During testing, the capacitance of the external capacitor $C_{OUT}$ and the value of the external current LOAD can be selected (e.g., adjusted) to ensure stability of the loop.

In one or more embodiments, a trimming procedure carried out during testing of the DC-DC converter 4 may comprise enabling the auxiliary loop 24' as discussed in the foregoing (e.g., connecting the loop circuitry 24' to the error amplifier 18 by closing a respective switch, not visible in the Figures annexed herein, while transistor Q6 may be permanently connected to the output node of the switching stage HB) and then setting (e.g., adjusting) the available trimming points in the main control loop of converter 4 to adjust the value of the output voltage $V_{OUT}$ to the desired value. For instance, the error amplifier 18 may be trimmed by calibrating its offset in a suitable manner, and/or the value of the reference voltage $V_{REF}$ may be trimmed. The trimming procedure disclosed herein takes into consideration the circuit blocks (16 and 18) that affect the accuracy of converter 4 during normal operation (i.e., in application conditions), so the trimmed output value $V_{OUT}$ will be as close as possible to the output value that will occur in normal operation of the converter 4. Additionally, in case of a desired shift, it is also possible to trim the value of the output voltage $V_{OUT}$ with a slightly different target value, so as to arrange the normal operation including an optional shift.

One or more embodiments as exemplified herein may thus provide one or more of the following advantages:
  reuse, for testing purposes, of the same circuits already available in a DC-DC converter loop and used in normal operation of the DC-DC converter, which facilitates monitoring the converter voltage regulation in operating conditions and detecting the possible block mismatch of the converter, so that virtually all sources of inaccuracy are taken into account during the trimming procedures;

provision of an auxiliary testing loop implemented downstream (e.g., after) the error amplifier of the feedback loop of the converter, so that the inaccuracy of the auxiliary loop may be negligible with respect to the inaccuracy of the feedback loop itself;

small silicon area increase;

no additional power consumption during normal operation of the DC-DC converter (e.g., when deployed in the final application), since the auxiliary loop may be disconnected even permanently from the main feedback loop of the converter (e.g., turned off and not used) once the trimming phase is finalized;

no need for a switching system in the automatic test ambient, resulting in a reduction of the cost and complexity of the testing equipment;

a faster, more reliable and/or more precise testing procedure compared to the previously known solutions, resulting in reduced cost and complexity of the testing phase;

applicability to all the control schemes of DC-DC converters, independently from their operation in continuous conduction mode (CCM), discontinuous conduction mode (DCM) or pulse-skip operation mode; and applicability to all DC-DC converter architectures (e.g., buck-boost, boost, buck, flyback, Cuk, SEPIC, and others).

Without prejudice to the underlying principles, the details and embodiments may vary, even significantly, with respect to what has been described by way of example only, without departing from the extent of protection.

The invention claimed is:

1. A switching DC-DC converter circuit, comprising:
   a switching stage including an input node configured to receive an input voltage and an output node configured to produce an output voltage;
   feedback loop circuitry coupled to said output node of said switching stage and configured to produce, at a loop output node, a control signal of the switching DC-DC converter circuit as a function of a difference between said output voltage and a reference voltage; and
   test loop circuitry arranged between the loop output node of said feedback loop circuitry and output node of said switching stage, wherein the test loop circuitry is configured, when enabled, to apply a current at the output node as a function of a value of said control signal of the switching DC-DC converter circuit;
   wherein said feedback loop circuitry is calibrated during a test phase of said switching DC-DC converter circuit.

2. The switching DC-DC converter circuit of claim 1, wherein the test loop circuitry is configured, when enabled, to apply the current at the output node by sourcing the current to the output node of the switching stage as a function of the value of the control signal of the switching DC-DC converter circuit.

3. The switching DC-DC converter circuit of claim 1, wherein the test loop circuitry is configured, when enabled, to apply the current at the output node by sinking the current from the output node of the switching stage as a function of the value of the control signal of the switching DC-DC converter circuit.

4. The switching DC-DC converter circuit according to claim 1, wherein said test loop circuitry includes one or more enabling switches configured to selectively couple said test loop circuitry to one or more of said loop output node of said feedback loop circuitry and said output node of said switching stage, and wherein said test loop circuitry is enabled by making conductive said one or more enabling switches and disabled by making non-conductive said one or more enabling switches.

5. The switching DC-DC converter circuit according to claim 1, wherein said test loop circuitry is coupled between said loop output node of said feedback loop circuitry and said output node of said switching stage, and wherein said test loop circuitry is enabled and disabled as a function of a test mode signal.

6. The switching DC-DC converter circuit according to claim 1, wherein said test loop circuitry comprises:
   a first transistor having a control terminal coupled to said loop output node of said feedback loop circuitry to receive said control signal, wherein a transistor current flowing through said first transistor is a function of said control signal;
   a current-to-voltage conversion circuit configured to produce a transistor control voltage for controlling an output transistor as a function of said transistor current flowing through said first transistor; and
   an output transistor coupled to the output node of said switching stage, the output transistor being configured to receive, at a respective control terminal, said transistor control voltage and to either source the current at the output node of said switching stage or sink the current at the output node of said switching stage as a function of a value of said transistor control voltage.

7. The switching DC-DC converter circuit according to claim 6, wherein:
   said first transistor has a source terminal coupled to a first supply voltage rail and a gate terminal coupled to said loop output node of said feedback loop circuitry to receive said control signal;
   said current-to-voltage conversion circuit comprises a current mirror circuit having a mirror input node coupled to a drain terminal of said first transistor and a mirror output node coupled to a first terminal of a resistor, the resistor having a second terminal coupled to a second supply voltage rail; and
   said output transistor has a source terminal coupled to said second supply voltage rail, a gate terminal coupled to said first terminal of said resistor, and a drain terminal coupled to the output node of said switching stage, the output transistor being configured to source the current at the output node of said switching stage.

8. The switching DC-DC converter circuit according to claim 7, wherein said first supply voltage rail is an internal supply voltage rail of the switching DC-DC converter circuit, and said second supply voltage rail is configured to receive said input voltage of said switching DC-DC converter circuit.

9. The switching DC-DC converter circuit according to claim 6, wherein:
   said first transistor has a source terminal coupled to ground and a gate terminal coupled to said loop output node of said feedback loop circuitry to receive said control signal;
   said current-to-voltage conversion circuit comprises a resistor having a first terminal coupled to a drain terminal of said first transistor and a second terminal coupled to a supply voltage rail; and said output transistor has a source terminal coupled to ground, a gate terminal coupled to said first terminal of said resistor, and a drain terminal coupled to the output node of said switching stage, the output transistor being configured to sink the current at the output node of said switching stage.

10. The switching DC-DC converter circuit according to claim 1, wherein said feedback loop circuitry comprises:
  a feedback voltage divider circuit coupled to the output node of said switching stage and configured to produce a feedback voltage as a function of a voltage partitioning of said output voltage; and
  an error amplifier configured to amplify a difference between said feedback voltage and said reference voltage to produce said control signal,
  wherein one or more of an offset voltage of said error amplifier and said reference voltage of the error amplifier are calibrated during the test phase of said switching DC-DC converter circuit.

11. The switching DC-DC converter circuit according to claim 10, wherein said feedback voltage divider circuit includes:
  a digital-to-analog converter circuit configured to convert a digital signal into an analog voltage signal;
  a buffer circuit configured to receive said analog voltage signal from said digital-to-analog converter circuit and produce a buffered analog voltage signal; and
  a voltage ladder circuit arranged between an output node of said buffer circuit and said output node of said switching stage and configured to produce, at an intermediate node thereof, said feedback voltage,
  wherein an offset voltage of said buffer circuit is calibrated during the test phase of said switching DC-DC converter circuit.

12. The switching DC-DC converter circuit according to claim 10, wherein said feedback voltage divider circuit includes a voltage ladder circuit arranged between said output node of said switching stage and a ground node and configured to produce, at an intermediate node thereof, said feedback voltage.

13. The switching DC-DC converter circuit according to claim 1, further including:
  voltage ramp generation circuitry configured to produce a ramp signal; and
  a comparator circuit configured to compare said ramp signal to said control signal to produce a pulse-width modulated signal for controlling switching activity of said switching stage;
  wherein said voltage ramp generation circuitry includes:
    a ramp generator circuit configured to produce a base ramp signal;
    a current sensing circuit configured to sense the current flowing through one or more switches of said switching stage and produce a signal indicative of said sensed current; and
    an adder circuit configured to add up said base ramp signal and said signal indicative of said sensed current to produce said ramp signal.

14. A method of testing a switching DC-DC converter circuit, comprising:
  setting the switching DC-DC converter circuit into a test operation mode by preventing switching activity of a switching stage and enabling test loop circuitry;
  applying a current to an output node of said switching stage as a function of a value of a control signal of the switching DC-DC converter circuit via said test loop circuitry;
  wherein applying the current to the output node of said switching stage is made via an external current generator circuit;
  sensing a value of an output voltage produced at the output node of said switching stage; and
  calibrating one or more electronic components of feedback loop circuitry until a desired value of said output voltage is produced at the output node of said switching stage.

15. The method according to claim 14, wherein applying the current comprises sourcing current to the output node of said switching stage; and wherein said external current generator circuit is a current source circuit.

16. The method according to claim 14, wherein applying current comprises sinking current from the output node of said switching stage; and wherein said external current generator circuit is a current sink circuit.

17. The method according to claim 14, further comprising calibrating an offset voltage of an error amplifier until a desired value of said output voltage is produced at said output node of said switching stage.

18. The method according to claim 14, further comprising calibrating a reference voltage of an error amplifier until a desired value of said output voltage is produced at said output node of said switching stage.

19. The method according to claim 14, further comprising calibrating an offset voltage of a buffer circuit until a desired value of said output voltage is produced at said output node of said switching stage.

* * * * *